United States Patent [19]

Rosenthal

[11] Patent Number: 4,617,519
[45] Date of Patent: Oct. 14, 1986

[54] TESTING DEVICE FOR A FLUORESCENT LAMP AND LAMP HOLDER

[76] Inventor: Eric Rosenthal, 66-22 Fleet St., Forest Hills, N.Y. 11375

[21] Appl. No.: 545,526

[22] Filed: Oct. 26, 1983

[51] Int. Cl.[4] ............................................. G01R 31/02
[52] U.S. Cl. ..................................... 324/414; 324/133
[58] Field of Search ................. 324/51, 133, 403, 405, 324/407, 414, 72.5; 340/514; 339/50 R, 53

[56] References Cited

U.S. PATENT DOCUMENTS

| | | | |
|---|---|---|---|
| 2,869,105 | 1/1959 | Pistey | 339/50 R |
| 3,688,185 | 8/1972 | Masengil | 324/414 |
| 4,258,313 | 3/1981 | Cheatham, Jr. et al. | 324/133 |

Primary Examiner—Stewart J. Levy
Assistant Examiner—Kevin D. O'Shea
Attorney, Agent, or Firm—Goodman & Teitelbaum

[57] ABSTRACT

A portable, self-contained, hand held fluorescent lamp and lamp holder testing device having a housing provided with a receptacle in one side thereof for receiving a pair of tube pins disposed at one end of a fluorescent lamp. A pair of prongs extend from an opposing side of the housing for insertion into a socket provided at one end of a lamp holder. Internally of the housing, there are provided a pair of spaced contact members for contacting the tube pins when inserted into the receptacle. A source of energy and an indicator member are serially connected to the contact members. The prongs are connected in series to the indicator member. Insertion of the tube pins completes the series circuit connection to provide an indication from the indicator member that one end of the fluorescent lamp is proper. The opposite end of the fluorescent lamp can similarly be tested. Likewise, the lamp holder is tested by insertion of the prongs into each socket, one socket at a time, to determine the operability of the lamp holder.

11 Claims, 7 Drawing Figures

TESTING DEVICE FOR A FLUORESCENT LAMP AND LAMP HOLDER

BACKGROUND OF THE INVENTION

This invention relates to fluorescent lamp testing devices, and more particularly to a portable, self-contained testing device for testing a fluorescent lamp and lamp holder.

Fluorescent lamps typically include a glass envelope, such as a tube, containing an inert gas and mercury vapor, and having a coating of fluorescent material on the interior surface of its glass envelope. The tube contains thermionic cathodes at both ends which are connected to suitable terminal prongs, referred to as tube pins. The fluorescent lamp fits into an appropriate lamp holder having opposing pairs of sockets. Each socket receives a pair of tube pins, there being one pair of tube pins extending from each base end of the fluorescent lamp.

In various situations, a fluorescent lamp may fail to light. However, the problem may not be a deficiency in the lamp itself. For example, a short may exist in the lamp holder, or the starter or starter circuit may be deficient, or a problem may exist within the wiring. However, the first approach taken by the repairman is to replace the fluorescent lamp. Should the lamp still not be illuminated, they then proceed to search for other reasons for the inoperativeness. However, the original lamp which was removed may still be discarded since there is no easy way of testing whether the lamp is still adequate.

In some fluorescent fixtures, two or more fluorescent lamps are connected in series within the lamp holder and may be fed by a common ballast. When one of the lamps becomes inoperative, it will automatically cause all of the lamps connected in series therewith to stop illuminating. When the repairman comes to replace the fluorescent lamps, he does not know which lamp is the defective one and which one is still good. The normal procedure, however, is to replace all of the lamps and discard all of the removed lamps. In this manner, at least one good lamp is being automatically discarded for an inability to be able to test its operability.

In the prior art, there have been provided various testing units for fluorescent lamps. However, these were generally complex apparatus requiring removal of the lamp to a remote testing site, and inserting it into a fixed or stationary testing unit. In many situations, the particular testing device also tested for numerous efficiencies of the fluorescent lamp and accordingly was extremely difficult to use and costly. For example, the testing units would test for the gaseous discharge, the illumination capabilities of the fluorescent material on the surface, the thermionic contact circuit, and numerous other operative aspects of the fluorescent lamp in order to determine not only its operability, but its efficiency and adequacy.

Because most of these complex testing units were stationary, costly, and complex to utilize, in most situations they were never used by the average repairman during common repairs. As a result, numerous fluorescent lamps were automatically discarded because of the unavailability of a simple fluorescent lamp testing device.

Additionally, in many cases, a lamp may have been discarded only to discover that the problem existed within the lamp holder. However, again there was no immediate way of testing the lamp holder either, until after the new lamp was inserted. At that point, if the lamp still failed to illuminate, the repairman would proceed to determine which aspect of the lamp holder was deficient. However, initially the lamp would first be discarded and replaced before the repairman could determine that the problem originated in the lamp holder and not in the lamp.

SUMMARY OF THE INVENTION

Accordingly, it is an object of the present invention to provide a fluorescent lamp testing device which is portable, self-contained, and can be quickly utilized by a repairman to test the operability of a fluorescent lamp.

Another object of the present invention is to provide a portable, self-contained fluorescent testing device which can be used to test each base end of a fluorescent lamp.

Another object of the present invention is to provide a portable, self-contained fluorescent lamp testing device, which can be utilized to test the thermionic cathode connections at each end of a fluorescent lamp.

A further object of the present invention is to provide a fluorescent lamp testing device which can be easily carried, readily utilized, and useful for testing, in situ, the operability of a fluorescent lamp.

Another object of the present invention is to provide a portable, self-contained fluorescent testing device which can be utilized for testing the operability of both a fluorescent lamp and the operability of a fluorescent lamp holder.

A further object of the present invention is to provide a fluorescent lamp testing device which can be easily coupled to each end of the fluorescent lamp in order to determine the operability of the lamp, and can also be individually inserted into each socket of a lamp holder to test the operability of the lamp holder.

Yet another object of the present invention is to provide a method for testing the operability of a fluorescent lamp by testing each end, utilizing a portable, self-contained testing device.

Another object of the present invention is to provide a method for testing a fluorescent lamp holder, by inserting a portable, self-contained testing device into each socket of the lamp holder.

The aforementioned and other objects, features and advantages of the present invention will, in part, be pointed out with particularity and will, in part, become obvious from the following more detailed description of the present invention, taken in conjunction with the accompanying drawings, which form an integral part thereof.

BRIEF DESCRIPTION OF THE DRAWING

In the drawings.

In the various figures of the drawing, like reference characters designate like parts.

DESCRIPTION OF THE PREFERRED EMBODIMENT

Figure 1:
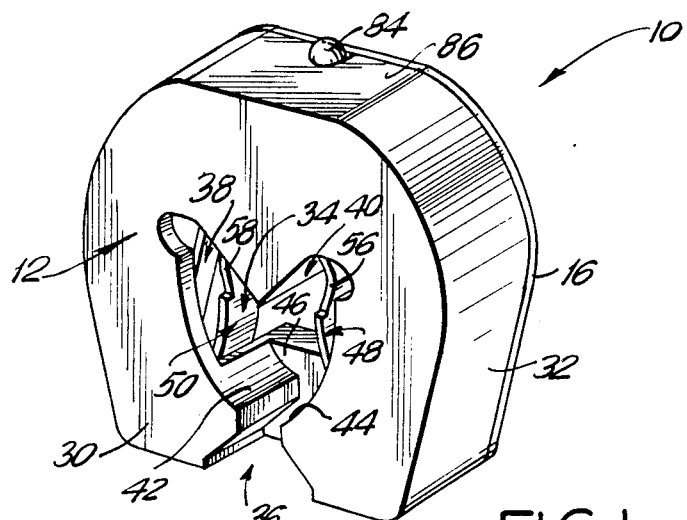
FIG. 1 is a perspective view of a fluorescent lamp testing device in accordance with a first embodiment of the present invention.
Figure 2:
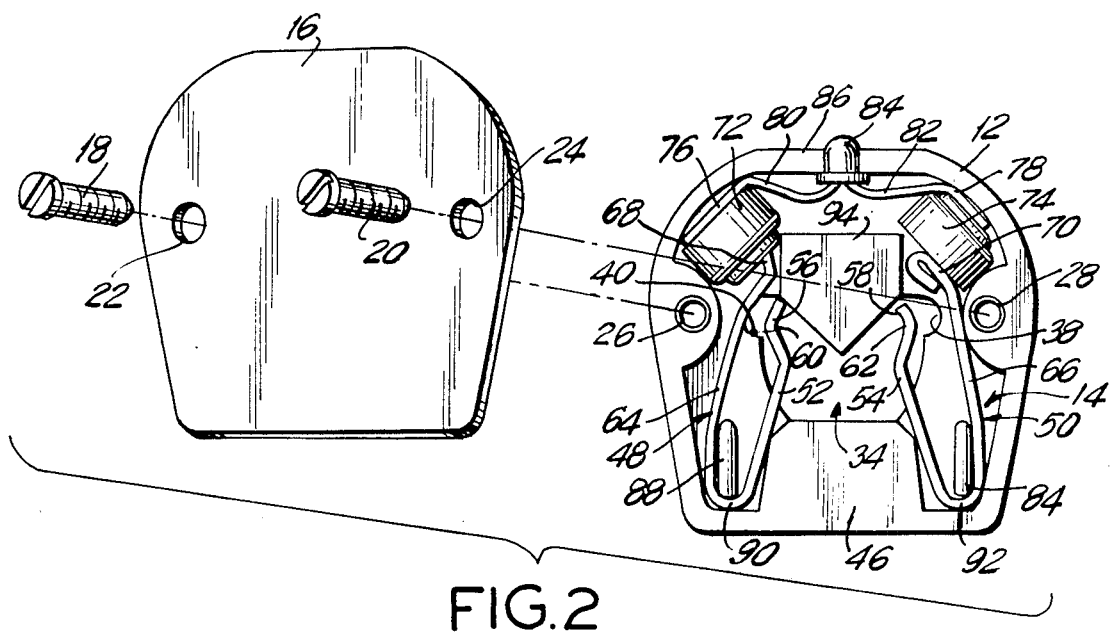
FIG. 2 is an exploded perspective view of the testing device shown in FIG. 1, showing the internal components of the testing device.

Referring now to FIGS. 1 and 2, the fluorescent lamp testing device is shown generally at 10 and includes a housing in the shape of a standard round socket, and including a body portion 12 having therein an internal chamber 14. The chamber 14 is closed by a cover 16 which fits onto the back of the body portion 12, and is secured in place by means of the threaded screws 18, 20 passing through clearance holes 22, 24 and threaded into the threaded holes 26, 28 provided in the body portion 12.

The body portion 12 includes a front wall 30 with a substantially U-shaped side wall 32 extending perpendicular to the front wall 30. A Y-shaped cutout 34 is formed into the front wall 30 to provide a lower entry port 36 in the bottom of the body portion 12, the entry port 36 continuing upward into the bifurcated open paths 38, 40. Side guard walls 42, 44 extend inwardly from the front wall 30 on either side of the entry port 36, and a rear wall 46 interconnecting the guard walls 42, 44.

Internally of the housing chamber 14, there are provided U-shaped contact members 48, 50 of spring steel material, being located on either side of the Y-shaped cutout 34. The contact members 48, 50 each include an inner leg portion 52, 54 which intercepts the bifurcated open path 38, 40. The distal end of each leg portion 52, 54 terminates in a finger 56, 58 so as to define a receiving groove 60, 62 in each leg portion respectively.

The opposing leg portions 64, 66 of the contact members 48, 50 extend upwardly and terminate in contact portions or pads 68, 70 which respectively contact a terminal of the removable batteries 72, 74. The other ends of the batteries 72, 74 are interconnected to contact pads 76, 78 as the ends of lead wires 80, 82 which interconnect to either side of a light emitting diode 84 extending through an opening in the top section 86 of the U-shaped side walls 32. The light emitting diode 84 is externally visable, as shown in FIG. 1.

The contact members 48, 50 are held in place by means of ribs 88, 89 extending into the chamber 14 from the inside of the front wall 30. The ribs 88, 89 abut within the bight portions 90, 92 of the contact members 48, 50. A separating block 94 inwardly extends into the chamber 14 from the front wall 30 and separates the bifurcated open paths 38, 40 while also limiting the movement of the leg portions 52, 54.

Figure 3:
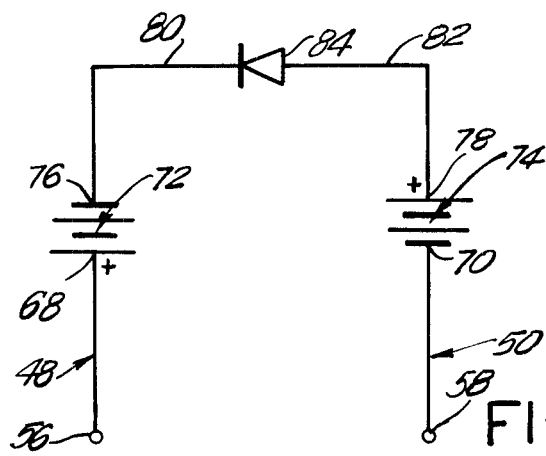
FIG. 3 is a simplified electrical circuit of the fluorescent lamp testing device shown in FIGS. 1 and 2.

The circuit connection provided within the housing is shown in FIG. 3, where the contact members 48, 50 including their contact terminals 56, 58 are serially interconnected to the batteries 72, 74 at 68, 70, and connected serially to the light emitting diode 84 by the lead wires 80, 82. The batteries have their polarities connected in series to provide a complete series circuit arrangement. When the contact members 48, 50 are interconnected by an operative lamp, a circuit will be completed to energize the light emitting diode 84 which will then illuminate.

In operation, when it is desired to test a particular fluorescent lamp, the hand held, portable, self-contained device 10 can be slipped onto one base end of a fluorescent lamp. The device is oriented so that the tube pins at the base end of the fluorescent lamp are vertically arranged with respect to the entry mouth 36 of the device. The tube pins are inserted into the mouth 36, and the device and the tube pins are relatively rotated with respect to each other whereby one tube pin will pass directly into one bifurcated open path 38 with the other tube pin being rotated to pass into the other bifurcated open path 40, or vice versa. The contact legs 52, 54 will retain the tube pins in place, where the tube pins will side into the grooves 60, 62 at the distal finger ends 56, 58 of the legs 52, 54 and be retained in electrical contact.

In a standard fluorescent lamp, the tube pins are connected to the thermionic cathodes within the fluorescent lamp, which are normally electrically interconnected internally of the lamp tube. If the thermionic cathodes are properly operative, this internal electrical connection within the fluorescent lamp will exist. Therefore, when the tube pins are seated in the bifurcated open paths 38, 40 of the testing device 10, they will contact the legs 52, 54 of the contact members 48, 50, thereby completing the series circuit through the above mentioned internal electrical connection within the lamp in order to illuminate the light emitting diode 84.

Accordingly, a repairman can test a fluorescent lamp, in situ, utilizing the hand held, portable, self-contained testing device 10, by placing it onto the tube pins at one of a fluorescent lamp. If the diode illuminates, then that end of the fluorescent lamp is electrically operative. The repairman can then place the device 10 onto the tube pins at the opposite end of the fluorescent lamp. If again the light emitting diode illuminates, then the fluorescent lamp is operative and need not be discarded.

Figure 4:
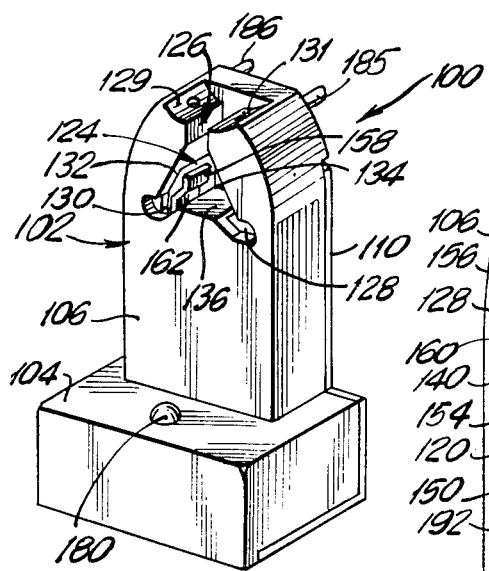
FIG. 4 is a perspective view of a fluorescent lamp and lamp holder testing device in accordance with a second embodiment of the present invention.

Referring now to FIG. 4, there is shown an alternate embodiment of the testing device, wherein the testing device is shown generally at 100 and is of the tombstone type. Such shaped devices are typically utilized as ordinary lamp holder sockets and therefore the shape thereof is readily recognized.

The device 100 comprises a housing 102 having an enlarged block shaped base portion 104 with an upstanding tombstone shaped section 106. The housing 102 includes an internal chamber 108 which is closed by means of the back cover member 110 inserted within a recess formed around the periphery of the housing 102. The cover member 110 is held in place by means of screws 112, 114 which pass through clearance holes 116, 118 in the cover member 110 and are threaded into the threaded apertures 120, 122 in back of the housing 102.

A substantially Y-shaped cutout 124 is formed into the front of the upstanding section 106. The cutout 124 includes an entry port 126 continuing into bifurcated open paths 128, 130. Guard walls 129, 131 are provided on either side of the entry port 126 and guide sections 132, 134 are formed along the initial portion of the open paths.

A bottom wall 136 separates the open paths at a lower limit of the Y-shaped cutout 124.

Figure 5:
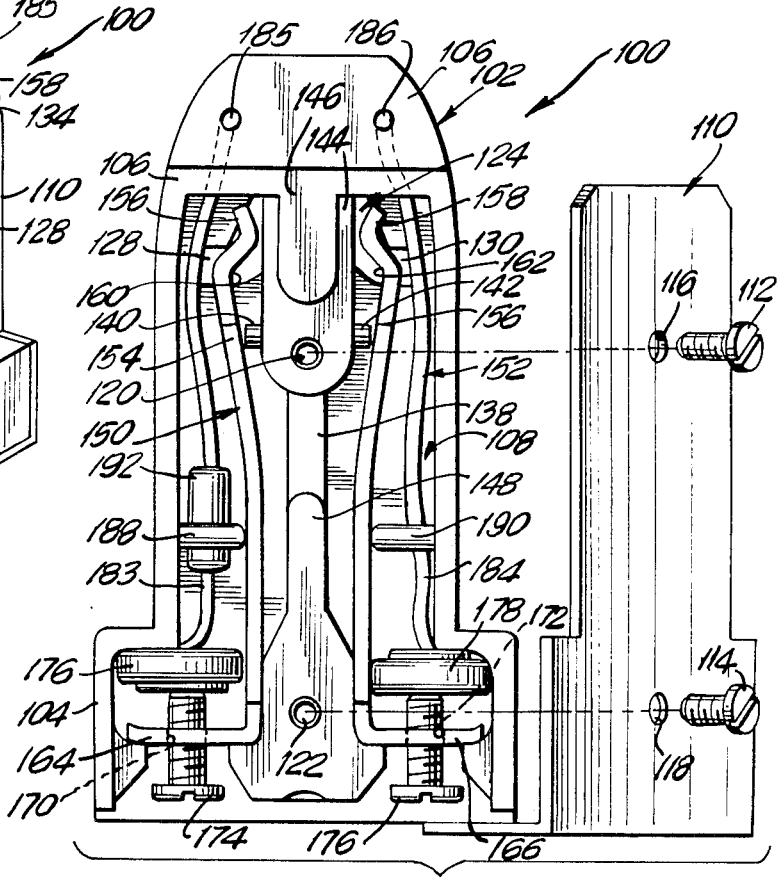
FIG. 5 is an exploded perspective view of the testing device of FIG. 4, showing the internal components thereof.

As best shown in FIG. 5, the internal chamber 108 is divided by means of an upstanding rib wall 138 from which laterally extend the limit pins 140, 142. A U-shaped housing section 144 is built up on an upper part of rib wall 138 in which the threaded aperture 120 is located. A further section 146 is built on the section 144 serving as a spacer to support the cover member 110. At the lower part of the rib wall, a further section 148 is built up in which the lower threaded aperture 122 is formed.

L-shaped contact members 150, 152 are positioned on opposite sides of the central rib wall 138. The L-shaped contact members include elongated legs 154, 156 which extend upwardly along the sides of the rib wall 138 and support the finger portions 156, 158 at their distal ends. The finger portions 156, 158 are bent to intercept the bifurcated open paths 128, 130 of the Y-shaped cutout 124. The fingers 156, 158 provide receiving recesses 160, 162 therebelow for retaining the tube pins of the lamp, as will hereinafter be explained.

The lower ends of the L-shaped contact members 150, 152 terminate in short legs 164, 166 which have threaded apertures 170, 172 therethrough for receiving respective contact screws 174, 176. The contact screws 174, 176 each respectively connect to one terminal of the removable batteries 176, 178. A light emitting diode 180 extends upwardly from the base 104 and is electrically interconnected by conventional lead wires 175, 177 to the other ends of the batteries 176, 178. Preferably, the diode 180 is a XC-5491 tri-state LED, well known in the art, having a red and green LED chip 181, 182 in inverse parallel. By reversing the polarity of the applied DC current, the LED 180 will emit red or green light, while an AC voltage results in yellow light, as set forth below.

Lead wires 183, 184 also interconnect in series with the light emitting diode 180, but are located in parallel with the contact members 150, 152 and pass into the upper portion of the upstanding housing section 106 to terminate in the prongs 185, 186. The prongs 185, 186 are spaced apart and extend outwardly from the back of the housing 102. The spacing between the prongs 185, 186 equals the spacing between the tube pins on a fluorescent lamp.

Lead wires 183, 184 are held in place by passing through the retaining walls 188, 190 extending inwardly from the side walls of the housing. A suitable voltage drop resistor 192 can be utilized in series with one of the lead wires 183, as is known in the art.

Figure 6:
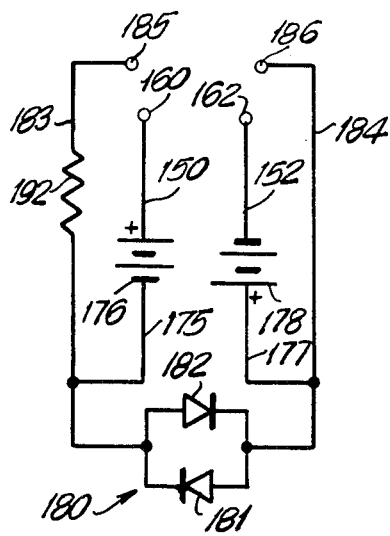
FIG. 6 is a simplified schematic circuit diagram showing the testing circuit of the embodiment shown in FIGS. 4 and 5.

The cirucit for the embodiment of FIG. 5 is shown in FIG. 6. Prongs 185, 186 are shown in series with the drop resistor 192 and are interconnected to the diode 180. Similarly, contact members 150, 152 are arranged in series, being connected across the batteries 176, 178 and onto the diode 180. When the contact members 150, 152 are interconnected, the light emitting diode 180 will be illuminated in either red or green light by the batteries 176, 178. When the contacts 185, 186 are connected to an external source, the diode will also illuminate in yellow light.

Figure 7:
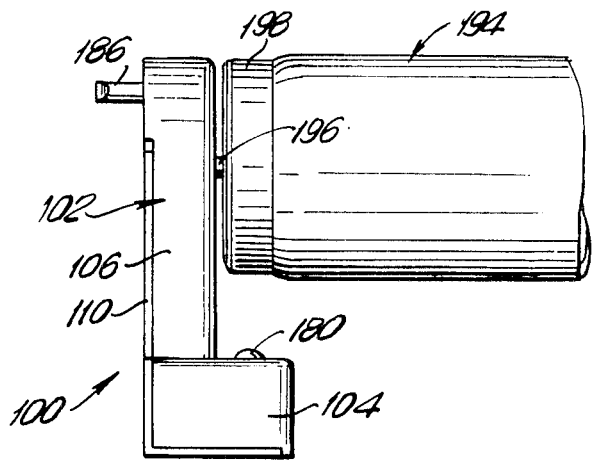
FIG. 7 shows an elevational view utilizing the testing device of FIG. 4 for testing one end of a fluorescent lamp.

As shown in FIG. 7, the operation of the device 100 is similar to that heretofore described. More particularly, a fluorescent lamp shown generally at 194 has its tube pins 196, which extend from its base 198, inserted into the Y-shaped cutout 124 of the housing 102, and aligned so that the tube pins 196 respectively are seated within the receiving grooves 160, 162 of the contact members 150, 152 to interconnect the contact members 150, 152. If this end of the fluorescent lamp 194 is properly operating, the light emitting diode 180 will be illuminated thereby indicating that this end of the fluorescent lamp is proper. Similarly, the other end of the fluorescent lamp 194 will be tested by inserting the tube pins at the other end of the fluorescent lamp 194 into the testing device 100. If these tube pins also cause the light emitting diode to illuminate, then the lamp 194 is operative.

The same testing device can also be utilized to test most lamp holders (not shown). By inserting the prongs 185, 186 of the device 100 into the socket at one end of a conventional lamp holder, in place of the usual tube prongs, that socket can be tested. When inserted into the lamp holder, the power source of the lamp holder, usually the house current, will flow through the diode 180. If the light emitting diode 180 illuminates, then that socket is operative. Similarly, the socket at the other end of the lamp holder will also be tested by inserting the prongs 185, 186 into that socket. If again the light emitting diode 180 is illuminated, then that socket will also be proper, and it will indicate that the lamp holder is electrically operative. However, it is noted, that the testing device 100, as shown, cannot be used to test a lamp holder provided with a starter, well known in the art, because the circuitry of the testing device 100 would require modification in order to test such starter type lamp holders.

It should therefore be appreciated, that the present device is one that can be easily carried in the pocket of a repairman and utilized, in situ, at the time of replacing fluorescent lamps. When one or more lamps are inoperative in a particular lamp holder, the lamps need not be immediately discarded. Each lamp can be tested individually to determine which one is actually inoperative. Also, the sockets of the lamp holder can be tested in most cases to determine if the problem causing the lack of illumination is a result of the failure of the lamp or of the lamp holder.

Since the device is small, portable, self-contained, and easily utilized, it can be used directly at the place of repairing and it is not necessary to transport the fluorescent lamps back to a stationary testing location in order to determine their operability.

In an embodiment of the present invention, the round type device 10 shown in FIGS. 1–3 has two Eveready E-13 button cell batteries, each having 1.5 volts. In the tombstone type device 100 shown in FIGS. 4–7, two Eveready No. 357 button cell batteries of 1.5 volts were utilized. It should be understood, however, that other voltages and other batteries could be used.

Furthermore, an audio device, such as known in the art, can be inserted into the circuitry of the testing devices 10 and 100 to provide a sound in association with the light from the diodes 84 and 180, or the audio device can be used in place of the diodes, if desired.

There has been disclosed heretofore the best embodiments of the invention presently contemplated. However, it is to be understood that various changes and modifications may be made thereto without departing from the spirit of the present invention.

What is claimed is:

1. A fluorescent lamp testing device comprising:
a portable housing having a flat front wall and an end wall adjacent to said front wall;
an opening provided in said side end wall and extending into said front wall as a Y-shaped cutout to define an entry port in said end wall connected to bifurcated open first and second paths in said front wall, ends of said first and second paths being remote from said entry port and providing first and second receptacles, respectively, for receiving therein a pair of tube pins disposed at one end of a fluorescent lamp;

said first and second receptacles being spaced apart a greater distance than transverse spacing across said entry port so that the pair of tube pins are passed one at a time through said entry port with one tube pin being inserted into said first receptacle and the other tube pin being rotated and inserted into said second receptacle to position the end of the fluorescent lamp in a facing arrangement with said front wall;

a pair of spaced apart first and second contact members disposed in said housing, said first and second contact members including cantilevered first and second arms of springy material respectively;

each of said first and second arms terminating in a bent finger to respectively provide first and second receiving seats facing each other, said first and second receiving seats being positioned inwardly of said first and second receptacles to respectively receive and contact the tube pins when inserted in said first and second receptacles and positioned between said first and second receiving seats;

said first and second receiving seats being biased towards each other to provide a retaining force therebetween for holding and retaining the tube pins when inserted between said first and second receiving seats;

a source of energy in said housing being coupled to said first and second contact members; and indicator means provided on said housing and connected in a series circuit arrangement with said first and second contact members and said source of energy so that insertion of the tube pins into said first and second receptacles to respectively contact said first and second receiving seats completes a circuit to energize said indicator means when the tube pins are electrically internally connected together thereby verifying operability of the inserted one end of the fluorescent lamp.

2. A testing device as in claim 1, wherein said source of energy comprises portable battery means.

3. A testing device as in claim 1, wherein said indicator means is a light emitting diode.

4. A testing device as in claim 1, wherein said testing device is a self-contained, hand held unit.

5. A fluorescent lamp testing device as in claim 1 in combination with a lamp holder tester, wherein a pair of spaced apart prongs extend from a flat rear wall of said housing, said prongs being connected to said indicator means in a second series circuit arrangement so that said indicator means is energized when said prongs are inserted into a socket of an operable fluorescent lamp holder to verify electrical completeness of the lamp holder.

6. A fluorescent lamp testing device in combination with a lamp holder tester as in claim 5, wherein resistor means are connected in said second series circuit arrangement.

7. A testing device as in claim 1, wherein at least said first contact member is U-shaped to provide a third arm connected to said first arm by a bight portion, a free end of said third arm engaging against a terminal of said source of energy for contact therewith.

8. A testing device as in claim 7, wherein said second contact member is also U-shaped to provide a fourth arm connected to said second arm by another bight portion, a free end of said fourth arm engaging against a terminal of a second source of energy for contact therewith, said indicator means connected between said first mentioned source of energy and said second source of energy.

9. A testing device as in claim 1, wherein at least said first contact member is L-shaped to provide a shorter third arm connected at a right angle to said first arm, a contact screw extending through said third arm and engaging against a terminal of said source of energy.

10. A testing device as in claim 9, wherein said second contact member is also L-shaped to provide a shorter fourth arm connected at a right angle to said second arm, another contact screw extending through said fourth arm and engaging against a terminal of a second source of energy, said indicator means being connected between said first mentioned source of energy and said second source of energy.

11. A testing device as in claim 1, wherein said housing has a removable rear wall to permit replacement of said source of energy, and means for removably securing said rear wall to said housing.

* * * * *